`US011175331B2`

United States Patent
Schneider et al.

(10) Patent No.: US 11,175,331 B2
(45) Date of Patent: Nov. 16, 2021

(54) AGING DETECTOR FOR AN ELECTRICAL CIRCUIT COMPONENT, METHOD FOR MONITORING AN AGING OF A CIRCUIT COMPONENT, COMPONENT AND CONTROL DEVICE

(71) Applicant: Robert Bosch GmbH, Stuttgart (DE)

(72) Inventors: Daniel Schneider, Eningen Unter Achalm (DE); Franz Dietz, Willmandingen (DE)

(73) Assignee: Robert Bosch GmbH, Stuttgart (DE)

( * ) Notice: Subject to any disclaimer, the term of this patent is extended or adjusted under 35 U.S.C. 154(b) by 663 days.

(21) Appl. No.: 16/074,686

(22) PCT Filed: Jan. 18, 2017

(86) PCT No.: PCT/EP2017/050953
§ 371 (c)(1),
(2) Date: Aug. 1, 2018

(87) PCT Pub. No.: WO2017/133891
PCT Pub. Date: Aug. 10, 2017

(65) Prior Publication Data
US 2021/0199708 A1   Jul. 1, 2021

(30) Foreign Application Priority Data
Feb. 3, 2016   (DE) .......................... 102016201596.6

(51) Int. Cl.
*G01R 31/02*   (2006.01)
*G01R 31/26*   (2020.01)
(Continued)

(52) U.S. Cl.
CPC ......... *G01R 31/2621* (2013.01); *G01R 27/02* (2013.01); *G01R 31/2601* (2013.01);
(Continued)

(58) Field of Classification Search
CPC ............ G01R 31/2621; G01R 31/2884; G01R 31/275; G01R 31/2831; G01R 31/2642;
(Continued)

(56) References Cited

U.S. PATENT DOCUMENTS

| 7,219,045 B1 | 5/2007 | Wu et al. |
| 2007/0167991 A1* | 7/2007 | DiLorenzo ........... A61B 5/0816 607/45 |

(Continued)

FOREIGN PATENT DOCUMENTS

| CN | 102508139 A | 6/2012 |
| CN | 104297003 A | 1/2015 |

(Continued)

OTHER PUBLICATIONS

International Search Report dated Apr. 11, 2017 of the corresponding International Application PCT/EP2017/050953.

(Continued)

*Primary Examiner* — Raul J Rios Russo
(74) *Attorney, Agent, or Firm* — Norton Rose Fulbright US LLP; Gerard Messina

(57) ABSTRACT

An aging detector for an electrical circuit component and a method for monitoring an aging of a circuit component includes an input of the aging detector recording a parameter of the circuit component, with the aging circuit being configured to, based on the recorded parameter, determine a corresponding response threshold and/or a response or adapt the response threshold and/or the response, and to initiate the response to the parameter exceeding the specific response threshold.

8 Claims, 3 Drawing Sheets

(51) Int. Cl.
  *G01R 27/02* (2006.01)
  *G01R 31/28* (2006.01)
  *G01R 31/27* (2006.01)
(52) U.S. Cl.
  CPC ....... *G01R 31/2642* (2013.01); *G01R 31/275* (2013.01); *G01R 31/2831* (2013.01); *G01R 31/2884* (2013.01); *H01L 2924/00* (2013.01); *H01L 2924/0002* (2013.01)
(58) Field of Classification Search
  CPC ............... G01R 31/2601; G01R 27/02; H01L 2924/0002; H01L 2924/00
  USPC ......... 324/71, 378, 403, 415, 425, 500, 537, 324/762.01, 762.09
  See application file for complete search history.

(56) References Cited

U.S. PATENT DOCUMENTS

| | | | |
|---|---|---|---|
| 2008/0275349 A1* | 11/2008 | Halperin | A61B 5/447 600/484 |
| 2009/0113358 A1 | 4/2009 | Goodnow et al. | |
| 2011/0101990 A1 | 5/2011 | Noorlag et al. | |
| 2012/0101411 A1* | 4/2012 | Hausdorff | A61B 5/6831 600/595 |
| 2012/0132211 A1* | 5/2012 | Halperin | A61B 5/1116 128/207.14 |
| 2014/0049242 A1 | 2/2014 | Shimizu et al. | |
| 2016/0312873 A1 | 10/2016 | Nakayama et al. | |
| 2017/0055090 A1* | 2/2017 | Gran | H04R 25/70 |
| 2020/0170548 A1* | 6/2020 | Hausdorff | A61B 5/1117 |

FOREIGN PATENT DOCUMENTS

| | | |
|---|---|---|
| CN | 104380126 A | 2/2015 |
| CN | 105158670 A | 12/2015 |
| DE | 10161998 A1 | 7/2003 |
| EP | 2884663 A1 | 6/2015 |
| JP | 2007060886 A | 3/2007 |
| JP | 2014077697 A | 5/2014 |

OTHER PUBLICATIONS

"On-Chip Silicon Odometers for Circuit Aging Characterization" by Keane, et. al.

"Biss Temperature Instability for Devices and Circuits," SPringer Science+Business Media, News York 2014, pp. 679-717by T. Grasser (ed.).

"On-Chip Aging Compensation for Output Driver," IEEE Reliability Physics Symposium, 2014, pp. CA.3.1-CA.3.5, by Kumar et al.

English language translation of Chinese Office Action dated Jun. 16, 2021, issued in corresponding Chinese Patent Application No. 201780009857.1.

"Emergency Management for Safe Production in Electric Power Enterprises", Nat. Emergency Rescue Command Ctr. for Safe Production, Coal Ind. Press, pp. 56-58, (2013).

* cited by examiner

AGING DETECTOR FOR AN ELECTRICAL CIRCUIT COMPONENT, METHOD FOR MONITORING AN AGING OF A CIRCUIT COMPONENT, COMPONENT AND CONTROL DEVICE

CROSS-REFERENCE TO RELATED APPLICATIONS

The present application is the national stage of International Pat. App. No. PCT/EP2017/050953 filed Jan. 18, 2017, and claims priority under 35 U.S.C. § 119 to DE 10 2016 201 596.6, filed in the Federal Republic of Germany on Feb. 3, 2016, the content of each of which are incorporated herein by reference in their entireties.

FIELD OF THE INVENTION

The present invention relates to an aging detector for an electrical circuit component, a method for monitoring an aging of a circuit component, a component, and a control device.

BACKGROUND

Integrated circuits contain a multiplicity of active and passive circuit components, also referred to as synonymous components, such as transistors, resistors and capacitors. In active and passive operation, these components are subject to aging mechanisms, for example, to temperature instability (NBTI for negative bias temperature instability) induced by negative bias voltage, HCI, and/or electromigration that can lead to a degradation of circuit component parameters, for example, to a change in threshold voltage, saturation current, internal resistance, and/or breakdown voltage, and thus to a malfunction or failure of the integrated circuit.

The components can be programmed to include information that can be read out non-destructively, from which a serial number and/or a production lot, a wafer number, an installation position of the component, and/or a packaging lot can be determined.

Malfunctions or failures must be avoided at all costs in applications that are critical to safety, such as automotive applications. It is, therefore, very worthwhile to obtain information on aging processes.

Using characterization data about the type and level of parameter degradation obtained from standardized measurement procedures, for example, JEDEC standard JP001.01 and AEC-Q100, performed on test structures and sample components, appropriate design measures can be employed to compensate for the influence of different aging mechanisms on an integrated circuit at least for one or also for a plurality of typical application fields. In real field operation, however, very different aging degradation characteristics are derived because of different types of circuits, operating conditions, and ambient parameters, such as temperature, and widely varying, manufacturing-induced properties of the semiconductor material.

German Patent Application No. DE 10161998 A1 describes a method for monitoring the operation of a system having a plurality of components, representative parameters for an aging of the components being recorded, a degree of aging of the individual components being determined by evaluating the parameter values for the individual components, and the exceedance of a threshold value of an aging factor being signaled, the aging factor being determined by cumulating the degrees of aging.

Further related art is described in U.S. App. Pub. Nos. 20120119825 A1, 20090113358 A1, and 20100214007 A1, by Keane et. al, "On-Chip Silicon Odometers for Circuit Aging Characterization," by T. Grasser (ed.), "Biss Temperature Instability for Devices and Circuits," Springer Science+Business Media, New York 2014, pp. 679-717, and by Kumar et. al, "On-Chip Aging Compensation for Output Driver," IEEE Reliability Physics Symposium, 2014, pp. CA.3.1-CA.3.5.

SUMMARY

According to an example embodiment of the present invention, an aging detector monitors an aging of an electrical circuit component. The aging detector includes at least one input for recording an aging-specific parameter of the circuit component and is preset to use at least the recorded parameter to determine a corresponding response threshold and/or a response or to adapt the response threshold and/or the response. The aging detector is also preset to initiate the response to the recorded parameter exceeding the specific response threshold. It is a characteristic of the aging detector that it is also preset to use the recorded parameter to determine the response threshold and/or to adapt the response threshold and/or the response.

Because of the possibility of determining or adapting the response threshold and/or the response, data that had not yet been available at the time of manufacturing the component can be used to define the response threshold and/or the response.

In an example embodiment, the recorded parameter is a frequency and/or a duration of a component-critical application of the circuit component. It is thus possible to record the influence the component-critical application has on aging.

The aging detector can include at least one output and be preset to apply a voltage thereto, and the aging detector can also be preset to record an electrical resistance or a threshold voltage drift in response to the application of a voltage.

This is advantageous since the electrical resistance can be used for monitoring an electromigration and/or the threshold voltage drift for monitoring a temperature instability effect (NBTI effect) of a MOS transistor induced by a negative bias voltage.

According to an example embodiment, a method for monitoring an aging of an electrical circuit component includes: determining at least one aging-specific parameter; determining a corresponding parameter-specific response threshold; initiating a response at least to the specific parameter exceeding the response threshold; adapting the response threshold and/or the response; and using the specific parameter to determine the response threshold and/or to adapt the response threshold and/or the response.

Because of the possibility of determining or adapting the response threshold and/or the response, data that had not yet been available at the time of manufacturing the component can be used to define the response threshold and/or the response.

In an example embodiment, the defined parameter is a frequency and/or a duration of a component-critical application of the circuit component.

In addition, the method can include the following: recording manufacturing data when manufacturing the circuit component and using the defined manufacturing data to adapt the response threshold and/or the response.

It is thus possible to compensate for fluctuations in the aging resistance of different production lots by subsequently adapting the response threshold and/or the response as well.

The component presented in accordance with the present invention includes the inventive aging detector. The control device presented in accordance with the present invention is suited for a vehicle and includes the inventive component.

In an example embodiment, the control device is preset to execute the method according to the present invention.

Exemplary embodiments of the present invention are clarified in greater detail on the basis of the drawings and the following description.

DETAILED DESCRIPTION

Figure 1:
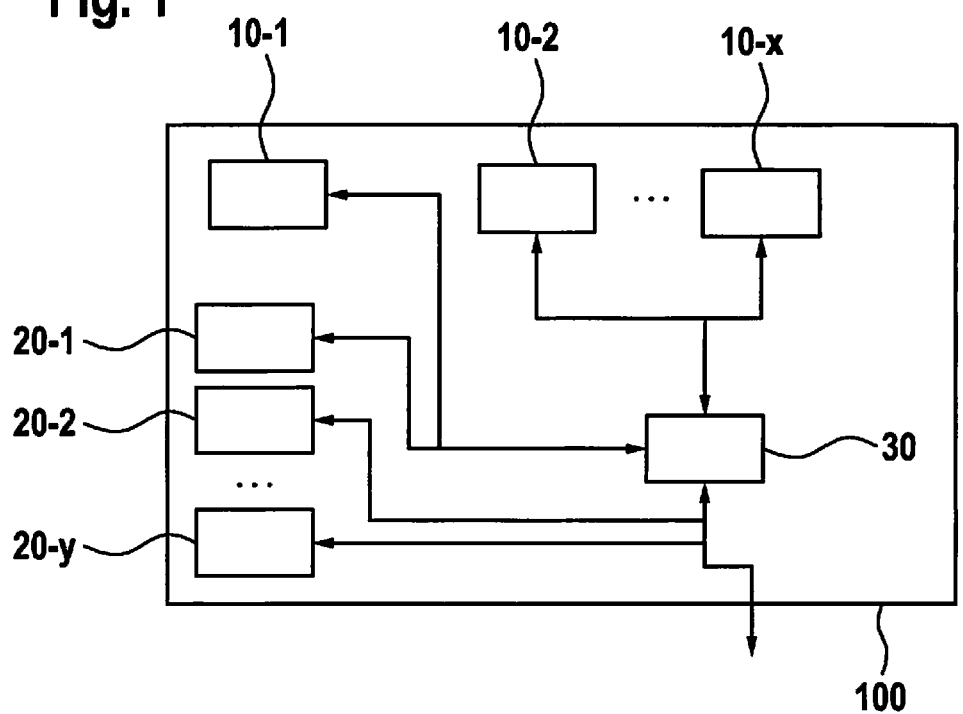
FIG. 1 is a block diagram of a component that is monitored according to an example embodiment of the present invention.

If errors occur in safety-critical electronic systems under special load conditions, these systems must be replaced—inter alia, for product liability reasons—to ensure that the component-critical combination of a high load condition and the lack of load capacity does not occur.

The load capacity is thereby an individual circuit component property that is subject to fluctuations in the real production sequence.

An error may, in turn, be dependent on a specific loading that took place previously, for example, on the delivery route, at the installation location, or upon installation of the component, due to the location of use, for example, the climate thereof, and because of user behavior.

However, if it is not known that an error is because of a specific loading, the result can be that entire production lots need to be recalled even though merely the circuits subject to the specific loading are to be recalled.

The exemplary embodiments of the present invention described in the following present, inter alia, a method that includes a monitoring of one or of a plurality of degradation mechanisms of a component and that uses a response threshold. In this instance, the response threshold is specifically for the component and the resistance (for example, temperature resistance or humidity resistance of the component). The response threshold is adapted using the monitored degradation mechanisms.

If degrading operating conditions or combinations of such conditions (for example, supply voltage, humidity, high temperature) act over long periods of operation, suitable remedial measures can be initiated upon reaching the set thresholds, for example, combinations of thresholds. These measures make it possible to prevent or delay a failure. Depending on the fault type, an alternative operating mode (for example, slower clocking frequency for a processor) or a redundancy can be activated as a measure, for instance. In the extreme case and when working with safety-critical components, the necessity to replace the component as a preventative measure can be signaled.

An example of a monitored degradation mechanism is a frequency and/or a duration of component-critical situations of use. Examples of component-critical situations of use include overvoltages, incorrect polarity, and excess temperature. The components are, in fact, designed to withstand such component-critical situations of use without damage for specified frequencies and/or durations. However, if such situations of use occur during operation more frequently and/or for longer periods of time than originally specified, this can lead to lasting component degradation and finally to failure of the component.

In exemplary embodiments, the monitored degradation mechanisms are used to also adapt the type of response to reaching or exceeding a response threshold.

Because of the possibility of subsequent adaptation, data that had not yet been available at the time of manufacturing the component can also be used to define the response threshold and/or the response.

To enable critical degradations to be recognized and eliminated prior to the occurrence of a malfunction, it is, in essence, about the possibility of feeding back information on manufacturing problems or insufficient reliability in already installed ASICs in the field.

To that end, the status data of the detectors already implemented in the field, for example, field observation and correlated production data, as well as application conditions, are read out to infer possible reliability problems therefrom. On the basis of the information obtained therefrom, the detector thresholds are adapted only in the ASIC concerned (limited, for example, to a production lot, a specific manufacturing period, or to a specific application) to enable the ASIC to output a timely warning before a critical state is reached.

For example, in a limited number of vehicle types (specific installation situations), the evaluation of field data of an ASIC type reveals that a spate of failures occur in regions having high air humidity. The correlation with the manufacturing data limits the ASIC concerned to a narrowly defined production period. In addition, the evaluation of the detector data reveals that, in the case of all of the ASICs concerned, a special detector (for example, humidity) had revealed elevated levels, but had not yet reached the response threshold originally set. The invention presented here is now able to lower the response threshold for the humidity detector in the course of an inspection, in the case of the ASICs from the respective production period, so that the detector reaches the threshold thereof before the ASIC fails. The limitation to the ASICs actually affected makes it possible, for one thing, to significantly lower the costs of recalls, but also the field failure figures.

Other exemplary specific embodiments of the present invention relate to aging detectors for directly or indirectly monitoring aging mechanisms or component-critical situations of use.

An exemplary embodiment of an aging detector is configured to apply a voltage via an output to a conductor array that is not used directly in the application circuit and whose electrical resistance is to be recorded and used to monitor the electromigration.

Another exemplary embodiment of an aging detector is configured for applying a voltage via an output to one MOS transistor, or simultaneously or successively to a plurality of MOS transistors, in order to record a threshold voltage drift and monitor the NBTI effect.

Another exemplary embodiment of an aging detector is configured to record one or a plurality of overvoltages, which can occur only in a component-critical situation of use, for example, a load dump in response to a vehicle battery being disconnected, at an input and to use a counter to count the number of individual events that occurred.

Again, another exemplary embodiment of an aging detector is configured to use a diode as a temperature sensor. In response to exceedance of a specific temperature, in combination with an oscillator-based timing signal, the duration of the excess temperature can be recorded and summed.

The method can also employ other aging detectors, whose monitoring is used to determine and store one or a plurality or a combination of a plurality of aging characteristics.

The characteristics can be evaluated, for example, during every starting procedure for the circuit in the field.

In addition, an evaluation can also be performed in the field for safety-critical applications in-situ permanently or at regular intervals.

When and which evaluation is performed can either be controlled internally by the integrated circuit or externally by the control device.

It can thereby be a question of the control device in which the component, respectively the integrated circuit is installed. In applications that involve a plurality of control devices, for example, in the automotive sector, another control device can also take over this control.

In some exemplary embodiments, it is additionally or alternatively possible to initiate an evaluation externally, for example, during an inspection or maintenance, for example, via a serial peripheral interface (SPI) or other communication interfaces, for example, cellular network, mobile Internet, or other cellular technologies in conjunction with the internal vehicle communication.

These characteristics are compared to response thresholds during the evaluation. The specific response thresholds can be defined or adapted for various time points.

Exemplary time points include a time point for a wafer test or final test; a time point following installation in a control device for communication with the component; a time point following installation in a vehicle or other object of the application; maintenance or inspection time points; and service time points during operation or in park mode.

Following installation in the control device, the evaluation is thereby performed via SPI, cellular networks or other cellular technologies, for example, in conjunction with the internal vehicle communication.

The response thresholds are initially determined on the basis of simulation or qualification data or aging-specific component parameters.

To that end, the monitored characteristics are evaluated in the case of continuously changing aging characteristics, such as parameter drifts, for example, and, on the basis of the maximum value thereof, a tested parameter range is documented, following completion of the components testing (for example, using AEC Q100). For example, the drift (and/or shift) $\Delta P=PE-P0$ of aging characteristic P is characterized during the test. In the production run, response threshold $P_{RS}$ is determined in this stage from value $P_{initial}$ initially measured during the component test and from the drift characterized during the test: $PRS=P_{initial}+0.9*\Delta P$. Scaling factor (in the example 0.9) is defined in a way that allows a warning to be issued during operation prior to exceedance of the tested parameter range.

In the case of characteristics in the form of counters, the response threshold is defined on the basis of occurrence frequencies specified in the product requirements document that were validated in the test.

For warnings concerning state variables (such as temperature), the definition is made on the basis of maximum values specified in the product requirements document. For this purpose, the detector signal (for example, current or voltage of the temperature diode) is to be suitably calibrated during the components testing. This can be accomplished by measuring the detector signal at various temperatures (typical ambient temperature 25° C. and high temperature 140-150° C.), and by storing the temperature characteristic in the form of derived temperature coefficients in the component memory. Alternatively, the response threshold can be directly derived from the high-temperature signal (for example, diode current at 150° C.). To that end, in the case of the desired temperature threshold (for example, 180° C.), the extent to which diode current I180 is greater than diode current I150 at the measurement temperature (for example, 150° C.) used in the component test is characterized beforehand on test components. With the aid of this correction factor KF=I180/I150 and initial measured value $P_{initial}$ during the component test at 150° C., the response threshold can be derived in the production run: $PRS=P_{initial}*KF$.

Moreover, application-specific information, such as vehicle, control device, installation location, maintenance intervals, and known ambient parameters (for example, expected temperature) can be used for determining the response threshold. The aim in defining the response threshold is to set the triggering of an alarm before a component-critical error occurs.

Moreover, the response thresholds can also be initially undefined, thus without value. In this case, the aging characteristic is initially continuously determined without being compared to a response threshold, and a response threshold is first determined at a later time point.

Following installation, the aging characteristics can be read out at regular intervals. Exemplary time points for the read out include maintenance and inspection time points, as well as service time points during operation or in park mode. The read out can take place via SPI, cellular networks or other cellular technologies, for example, in conjunction with the internal vehicle communication.

The aging data collected in this manner can be evaluated specifically for the component and application and used for further adaptation of the response thresholds.

Moreover, information about malfunctions in the wafer processing or packaging or the transport of individual production lots, wafers, or components can also be subsequently used for adapting the reaction thresholds.

Moreover, all other information indicative of a possible fault case of the component can be used for adapting the response thresholds.

The type of response to reaching or exceeding a response threshold can also be variably defined.

Exemplary responses include: no response; deactivating the component or individual functional groups; warning during inspection or maintenance; warning to a user during operation by a warning transmitter, for example, a yellow or red warning light; and warning to the manufacturer of the component, for example, via SPI, cellular networks, or other cellular technologies, for example, in conjunction with the internal vehicle communication.

The type of response can be defined or adapted at various adaptation time points. Exemplary adaptation time points include the time point of the wafer test or final test; the time point following installation in the control device by communicating with the component; the time point following installation in the vehicle or other object of the application; maintenance or inspection time points and service time points during operation or in park mode.

FIG. 1 shows a block diagram of a component 100 that is monitored in accordance with an exemplary embodiment of the present invention. Component 100 includes an evaluation unit 10, aging detectors 20-1, ..., 20-x, and detectors 30-1, ..., 30-y for component-critical applications. Evaluation unit 10 thereby communicates preferably, but not necessarily, bidirectionally, with aging detectors 20-1, ..., 20-x and with detectors 30-1, ..., 30-y for component-critical applications. Evaluation unit 10 thereby communicates preferably, but not necessarily, bidirectionally, with a corresponding control device, with the object of the application in which component 100 is used, and with devices outside of the object of the application.

Figure 2:
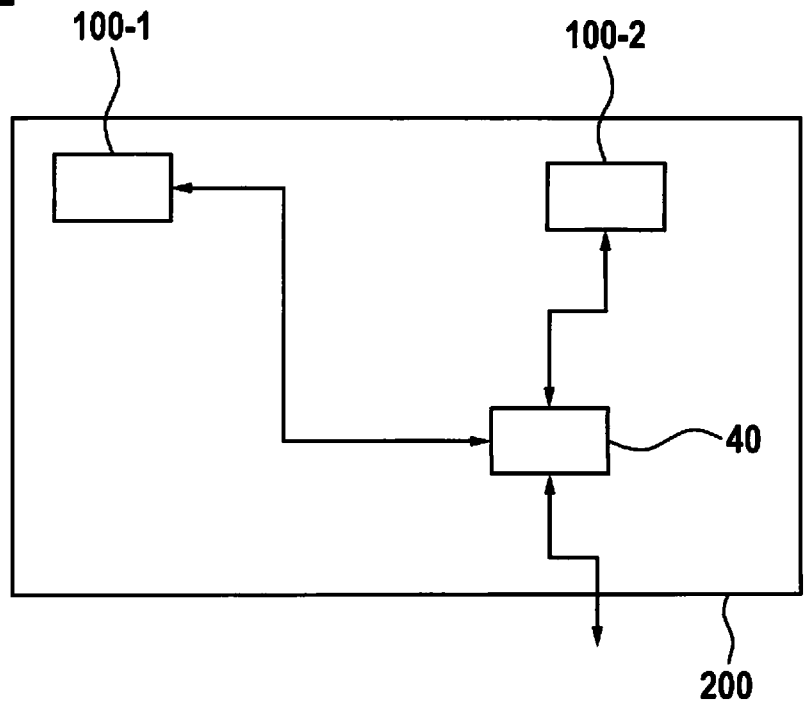
FIG. 2 is a block diagram of a control device that is monitored according to an example embodiment of the present invention.

FIG. 2 shows a block diagram of a control device 200 that monitors components in accordance with an exemplary embodiment of the present invention.

The control device includes exemplarily two monitored components 100-1, 100-2 and one control unit 40. Control unit 40 communicates preferably, but not necessarily, bidirectionally, with the evaluation units of monitored components 100-1, 100-2. Control unit 40 also communicates, again preferably, but not necessarily, bidirectionally, with the object of the application in which component 100 is used, and with devices outside of the object of the application.

Figure 3:
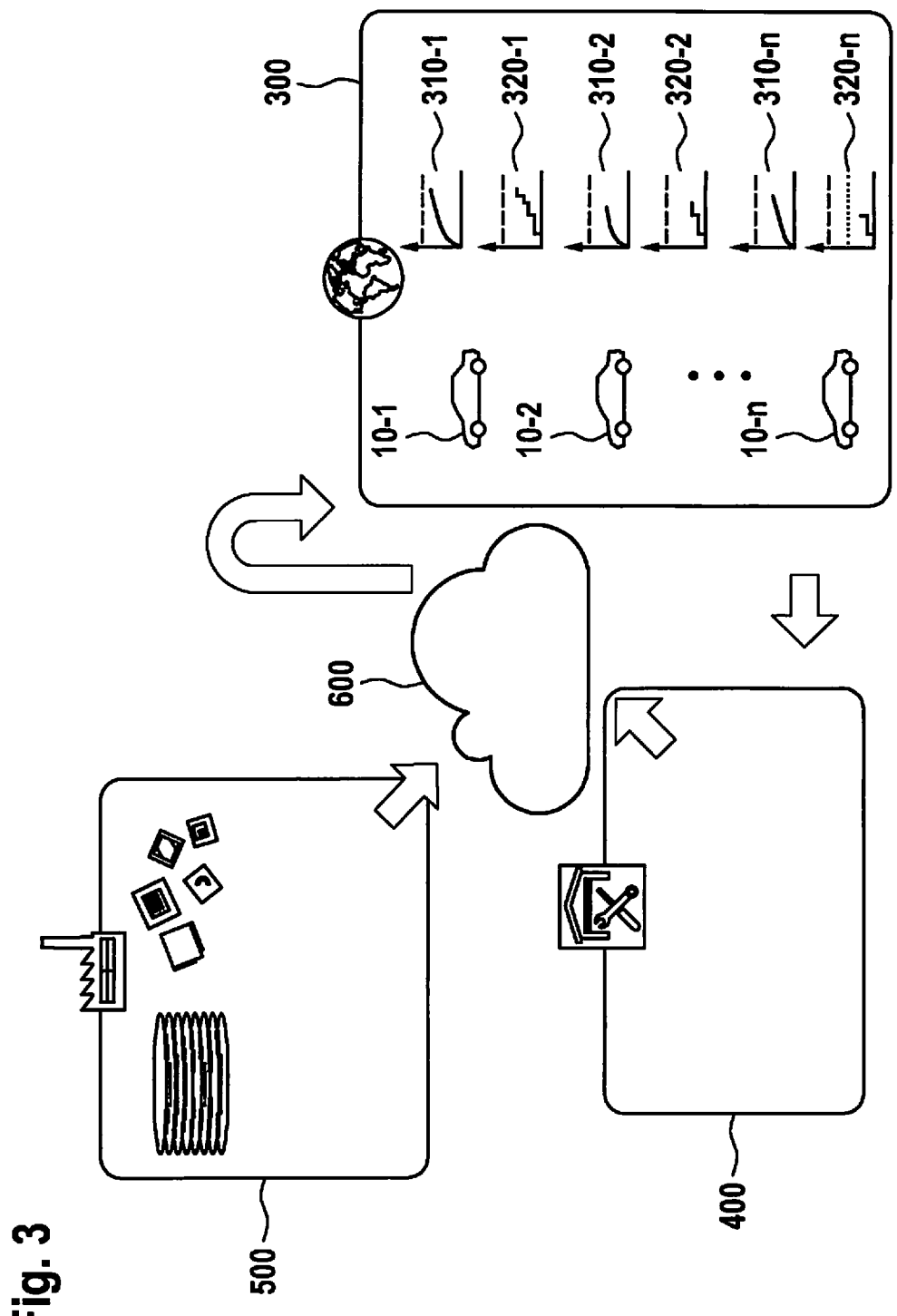
FIG. 3 illustrates adapting a response threshold according to an example embodiment of the present invention.

FIG. 3 is an example for adapting a response threshold. An ASIC that monitors various aging mechanisms, for example, (measurement curves 310-1, 310-2, ..., 310-n recorded by a respective sensor A) and/or critical situations (measurement curves 320-1, 320-2, ... 320n recorded by a respective sensor B) is used in field 300 in various vehicles 10-1, 10-2, ... 10-n. During routine service and/or in fault cases that occur, these sensors are read out, together with the ID of the ASIC, in a service operation 400. Conspicuous production lots can be identified from the correlation 600 of these field data with the manufacturing data from manufacturing plant 500. An example is that all ASICs from a specific production period can fail unexpectedly already upon reaching a reduced threshold of sensor B. On the basis of this evaluation, the threshold for sensor B can be lowered during the next service or in the course of a recall to a degree that enables the system to warn the driver in a timely manner before the newly defined failure range is reached.

Figure 4:
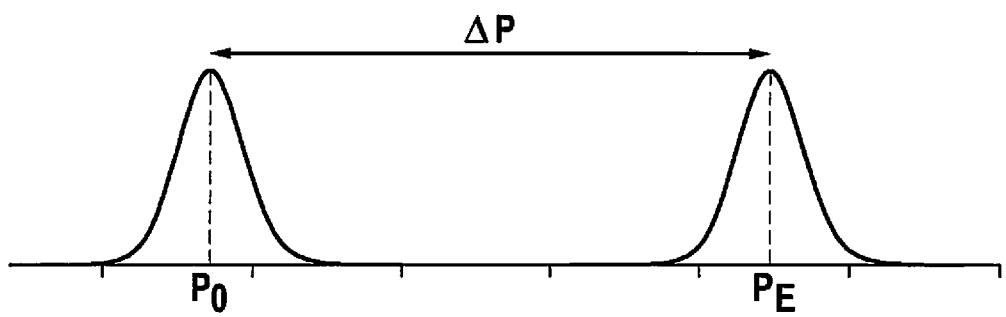
FIG. 4 is an example for shifting ΔP of an aging characteristic P according to an example embodiment of the present invention.

FIG. 4 shows an example of shift ΔP of aging characteristic P during the components testing from initial value $P_o$ to final value $P_E$. For example, corresponding response threshold $P_{RS}$ for a component provided in the field can be derived from initial measured value $P_{initial}$ thereof and characterized shift ΔP as follows: $P_{RS}=P_{initial}+0.9*\Delta P$.

What is claimed is:

1. An aging detector, comprising:
   at least one input for recording an aging specific parameter of a circuit component;
   wherein the aging detector is for use with an evaluation unit and is configured to perform the following:
      based on the recorded aging specific parameter, at least one of determining and adapting at least one of a corresponding response and a corresponding response threshold of the response; and
      initiating the response responsive to the recorded parameter exceeding the response threshold;
      wherein a type of the response is defined or adapted at adaptation time points,
      wherein the aging specific parameter includes a measurement curve,
      wherein the evaluation unit communicates bi-directionally with the aging detector, and
      wherein the evaluation unit communicates bi-directionally with a control device.

2. The aging detector of claim 1, wherein the recorded parameter is at least one of a frequency and a duration of a component-critical application of the circuit component.

3. The aging detector of claim 1, further comprising:
   at least one output, wherein the detector is configured to apply a voltage to the at least one output and to record an electrical resistance or a threshold voltage drift in response to the application of the voltage.

4. The aging detector of claim 3, wherein, based on the electrical resistance, the detector is configured to monitor an electro-migration of a metal oxide semiconductor transistor (MOS transistor) induced by a negative bias voltage.

5. The aging detector of claim 3, wherein, based on the threshold voltage drift, the detector is configured to monitor a temperature instability effect (NBTI effect) of a metal oxide semiconductor transistor (MOS transistor) induced by a negative bias voltage.

6. A method for monitoring an aging of an electrical circuit component, the method comprising:
   determining, via an aging detector, at least one aging specific parameter;
   based on the recorded aging specific parameter, at least one of determining and adapting, via the aging detector, at least one of a corresponding response and a corresponding response threshold of the response; and
   initiating the response responsive to the recorded parameter exceeding the response threshold;
   wherein a type of the response is defined or adapted at adaptation time points,
   wherein the aging specific parameter includes a measurement curve,
   wherein an evaluation unit communicates bi-directionally with the aging detector, and
   wherein the evaluation unit communicates bi-directionally with a control device.

7. The method of claim 6, further comprising:
   recording manufacturing data when manufacturing the circuit component and using the manufacturing data to adapt at least one of the response threshold and the response.

8. A system, comprising:
   a circuit component; and
   a plurality of aging detectors; and
   an evaluation unit, which communicates bi-directionally with each of the aging detectors;
   wherein each of the aging detectors includes at least one input for recording an aging specific parameter of a circuit component, wherein the aging detector is configured to perform the following:
      based on the recorded aging specific parameter, at least one of determining and adapting at least one of a corresponding response and a corresponding response threshold of the response; and
      initiating the response responsive to the recorded parameter exceeding the response threshold;
      wherein a type of the response is defined or adapted at adaptation time points, and
      wherein the aging specific parameter includes a measurement curve, and
      wherein the evaluation unit communicates bi-directionally with a control device.

* * * * *